(12) United States Patent
Shinohara et al.

(10) Patent No.: US 9,391,116 B2
(45) Date of Patent: Jul. 12, 2016

(54) IMAGING APPARATUS, IMAGING SYSTEM AND MANUFACTURING METHOD OF IMAGING APPARATUS

(71) Applicant: CANON KABUSHIKI KAISHA, Tokyo (JP)

(72) Inventors: Mahito Shinohara, Tokyo (JP); Hideomi Kumano, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/578,117

(22) Filed: Dec. 19, 2014

(65) Prior Publication Data

US 2015/0179698 A1    Jun. 25, 2015

(30) Foreign Application Priority Data

Dec. 25, 2013 (JP) ................. 2013-267136

(51) Int. Cl.
*H01L 27/146* (2006.01)

(52) U.S. Cl.
CPC .... *H01L 27/14679* (2013.01); *H01L 27/14689* (2013.01)

(58) Field of Classification Search
CPC .......... H01L 27/146; H01L 27/14643
See application file for complete search history.

(56) References Cited

U.S. PATENT DOCUMENTS

| 6,037,194 A * | 3/2000 | Bronner ........... H01L 27/10876 257/E21.651 |
| 7,612,378 B2 | 11/2009 | Toyoda |
| 8,013,369 B2 | 9/2011 | Iwata |
| 8,462,249 B2 | 6/2013 | Shinohara |
| 2013/0221416 A1 | 8/2013 | Yanagita |

FOREIGN PATENT DOCUMENTS

| JP | 2007-165736 A | 6/2007 |
| WO | 2011/048929 A1 | 4/2011 |

\* cited by examiner

*Primary Examiner* — Mohammad Choudhry
(74) *Attorney, Agent, or Firm* — Canon USA, Inc. IP Division

(57) ABSTRACT

A junction type field effect transistor (JFET) in a substrate includes channel and source regions of a first conductivity type and first through fourth gate regions of a second conductivity type. The first and second gate regions are disposed in a direction along a surface of the substrate. The third and fourth gate regions are disposed in the direction. The first and third gate regions are disposed in a depth direction. The first gate region is disposed between the surface and the third gate region. The second and fourth gate regions are disposed in the depth direction. The second gate region is disposed between the surface and the fourth gate region. The channel region includes a first region disposed between the first and third gate regions and a second region disposed between the second and fourth gate regions. The source region is disposed between the first and second gate regions.

20 Claims, 9 Drawing Sheets

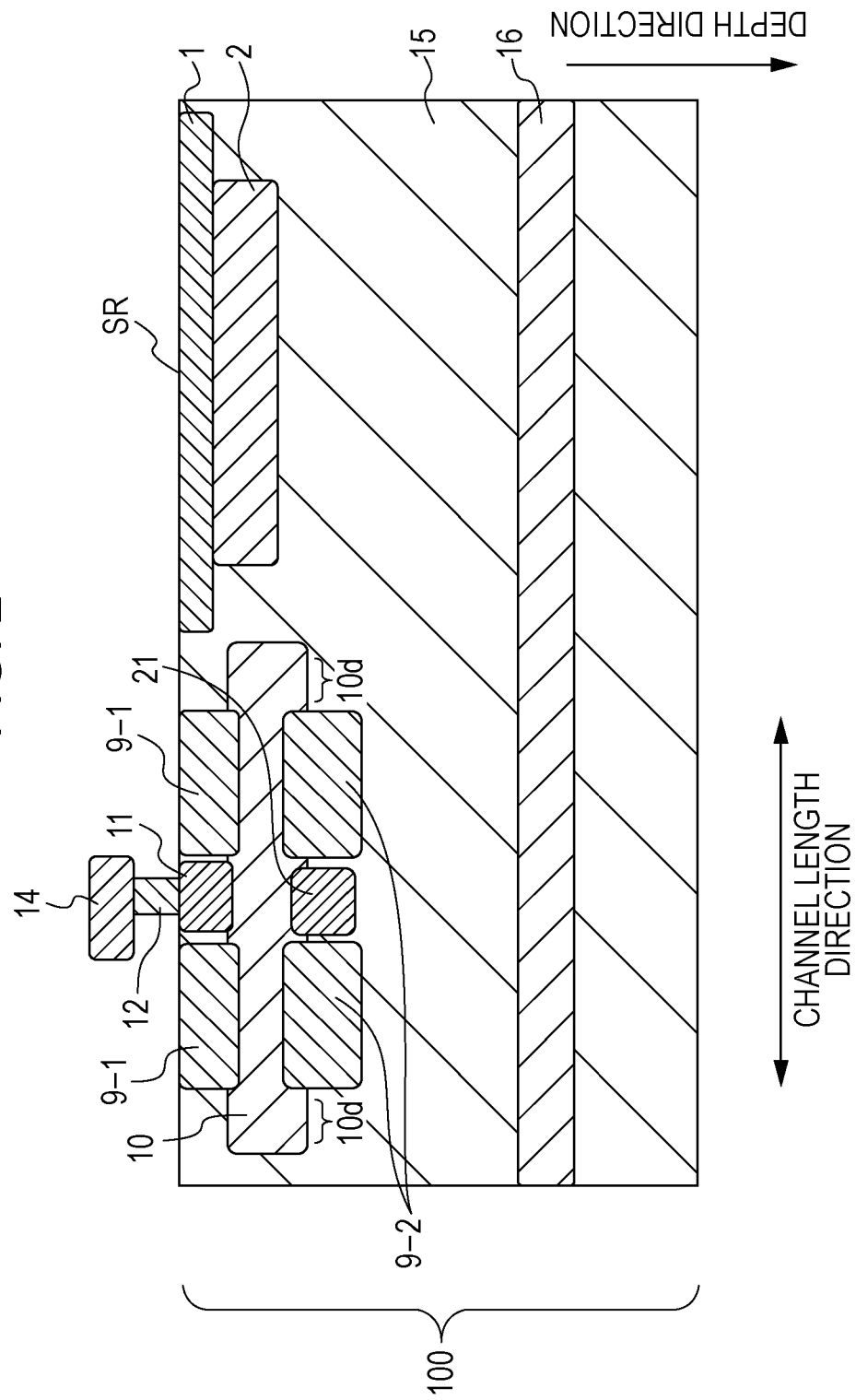

IMAGING APPARATUS, IMAGING SYSTEM AND MANUFACTURING METHOD OF IMAGING APPARATUS

BACKGROUND OF THE INVENTION

1. Field of the Invention

The present disclosure relates to imaging apparatus, imaging systems and manufacturing methods of imaging apparatus.

2. Description of the Related Art

An imaging apparatus which utilizes Junction type Field Effect Transistors has been proposed. Japanese Patent Laid-Open No. 2007-165736 describes an imaging apparatus including a plurality of pixels. Each pixel includes a Junction type Field Effect Transistor. In the Junction type Field Effect Transistor described in Japanese Patent Laid-Open No. 2007-165736, a channel region is sandwiched between a surface gate region and a buried gate region. The channel region is connected to a drain region at the end portion of the buried gate region.

SUMMARY OF THE INVENTION

According to a first aspect of the present disclosure, an imaging apparatus is provided. The imaging apparatus includes a junction type field effect transistor provided in a semiconductor substrate. The junction type field effect transistor includes a channel region of a first conductivity type, a source region of the first conductivity type, and first through fourth gate regions of a second conductivity type. The first gate region and the second gate region are disposed in a direction along a surface of the semiconductor substrate. The third gate region and the fourth gate region are disposed in the direction along the surface of the semiconductor substrate. The first gate region and the third gate region are disposed in a depth direction of the semiconductor substrate. The first gate region is disposed between the surface and the third gate region. The second gate region and the fourth gate region are disposed in the depth direction. The second gate region is disposed between the surface and the fourth gate region. The channel region includes a first region and a second region. The first region is disposed between the first gate region and the third gate region. The second region is disposed between the second gate region and the fourth gate region. The source region is disposed between the first gate region and the second gate region. A semiconductor region of the second conductivity type is disposed between the third gate region and the fourth gate region. The semiconductor region of the second conductivity type has an impurity density which is lower than an impurity density of the third gate region and is lower than an impurity density of the fourth gate region.

According to another aspect of the present disclosure, an imaging apparatus is provided. The imaging apparatus includes a junction type field effect transistor provided in a semiconductor substrate. The junction type field effect transistor includes a channel region of a first conductivity type, a source region of the first conductivity type, and first through fourth gate regions of second conductivity types. The first gate region and the second gate region are disposed in a direction along a surface of the semiconductor substrate. The third gate region and the fourth gate region are disposed in the direction along the surface of the semiconductor substrate. The first gate region and the third gate region are disposed in a depth direction of the semiconductor substrate. The first gate region is disposed between the surface and the third gate region. The second gate region and the fourth gate region are disposed in the depth direction. The second gate region is disposed between the surface and the fourth gate region. The channel region includes a first region and a second region. The first region is disposed between the first gate region and the third gate region. The second region is disposed between the second gate region and the fourth gate region. The source region is disposed between the first gate region and the second gate region. A semiconductor region of the first conductivity type is provided to spatially continue from the third gate region to the fourth gate region.

According to another aspect of the present disclosure, an imaging apparatus is provided. The imaging apparatus includes a junction type field effect transistor provided in a semiconductor substrate. The junction type field effect transistor includes a channel region of a first conductivity type, a source region of the first conductivity type and a semiconductor region of a second conductivity type. The channel region is disposed between the semiconductor region and a surface of the semiconductor substrate. At least a part of the source region is disposed between the channel region and the surface. The semiconductor region includes a first portion, a second portion and a third portion. An impurity density of the first portion is lower than an impurity density of the second portion and is lower than an impurity density of the third portion. The first portion is disposed between the second portion and the third portion. An orthogonal projection of the first portion onto a plane parallel to the surface overlaps with an orthogonal projection of the source region onto the plane.

According to another aspect of the present disclosure, an imaging system is provided. An imaging system includes the imaging apparatus described above and a signal processing unit configured to process a signal output from the imaging apparatus.

Further features of the present disclosure will become apparent from the following description of exemplary embodiments with reference to the attached drawings.

BRIEF DESCRIPTION OF THE DRAWINGS

FIG. 2 is a diagram schematically illustrating a cross sectional structure of an imaging apparatus.

DESCRIPTION OF THE EMBODIMENTS

According to some embodiments of the present disclosure, a characteristic of a Junction type Field Effect Transistor can be improved.

In the Junction type Field Effect Transistor known to the inventor, a part of the gate region is arranged or disposed under the source region. An impurity density profile, or distribution, is uniform. Accordingly, if the gate region has a high impurity density, an impurity density of a region under the source region may be high.

If the impurity density of the region under the source region is high, a channel current output from the Junction type Field Effect Transistor may vary due to a depletion of the source region. In other words, a characteristic of the Junction type Field Effect Transistor may deteriorate.

Some embodiments of the present disclosure provide an imaging apparatus including a Junction type Field Effect Transistor where a characteristic thereof can be improved.

An embodiment of the present disclosure provides an imaging apparatus including a plurality of pixels. Each pixel includes a Junction type Field Effect Transistor (hereinafter, referred to as JFET). The JFET includes a gate region, a channel region, a drain region and a source region, respectively formed in a semiconductor substrate. In the JFET, a conductivity type of the gate region is different from conductivity types of the channel region, the drain region and the source region. In the present embodiment, the imaging apparatus utilizes a lateral JFET where a direction of channel current is parallel to the surface of the semiconductor substrate.

Embodiments according to the present disclosure are featured in the structure of a semiconductor region provided at a deeper position than the channel region and/or in the manufacturing method thereof.

Hereinafter, embodiments of the present disclosure will be described in detail with reference to the appended drawings. The present disclosure is not restricted to embodiments alone that will be described below. Also, examples in which a partial configuration of one of the following embodiments is added to another embodiment or replaced with a partial configuration of another embodiment are also embodiments of the present disclosure.

In embodiments to be described, the gate region is of P-type, and the channel region, the drain region and the source region are of N-type. The present disclosure includes embodiments where the conductivity type of each semiconductor region is reversed.

First Embodiment

Figure 1:
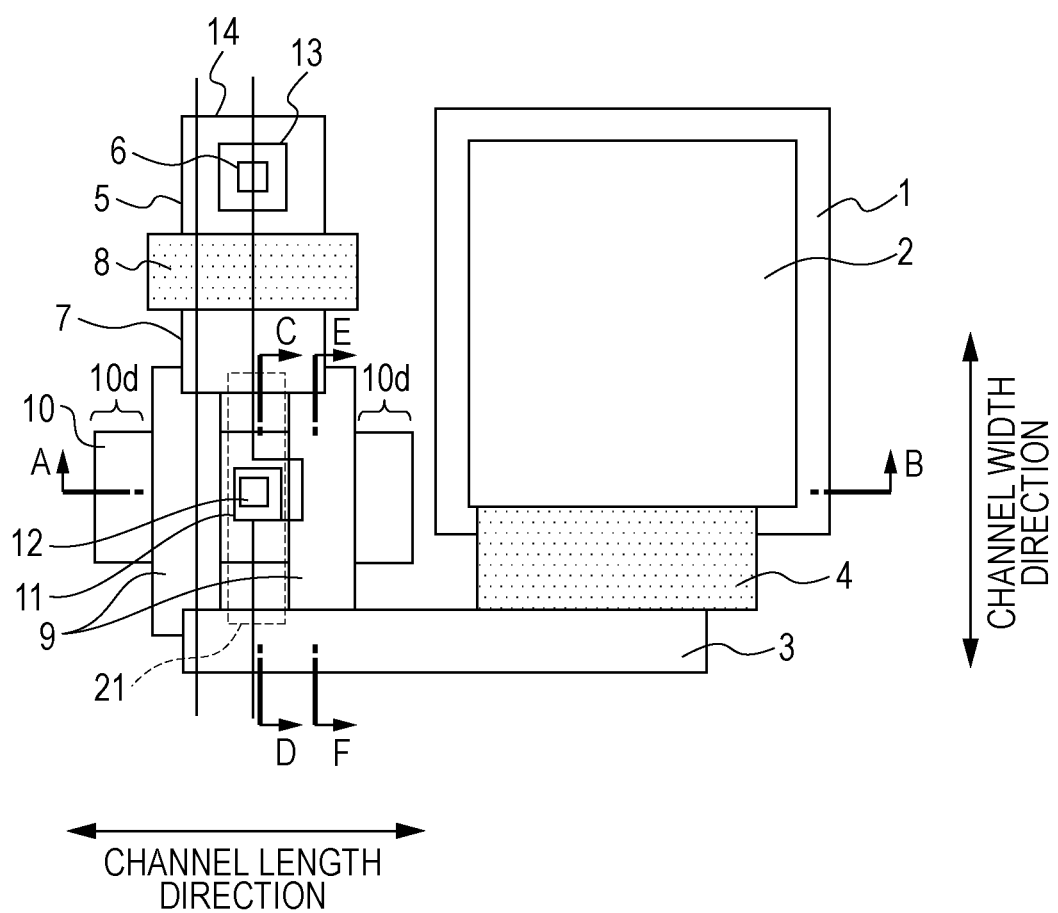
FIG. 1 is a diagram schematically illustrating a planar structure of an imaging apparatus.

FIG. 1 is a diagram schematically illustrating a planar structure of an imaging apparatus of the present embodiment. FIG. 1 illustrates one pixel. The pixel includes a photoelectric conversion portion such as a photodiode, a transfer transistor, a reset transistor and a JFET. The imaging apparatus of the present embodiment includes a plurality of the pixel illustrated in FIG. 1.

In the present embodiment, the photoelectric conversion portion is a photodiode. The photodiode includes an N-type semiconductor region 1 formed in the surface of the semiconductor substrate and a P-type semiconductor region 2 formed under the N-type semiconductor region 1. The N-type semiconductor region 1 and the P-type semiconductor region 2 form a P-N junction. A hole generated by incident light is accumulated in the P-type semiconductor region 2 as a signal charge. The signal charge accumulated in the P-type semiconductor region 2 is transferred to a floating diffusion region 3 (hereinafter, referred to as FD region 3). The FD region 3 is a P-type semiconductor region. A transfer gate electrode 4 transfers the signal charge from the P-type semiconductor region 2 to the FD region 3.

The JFET includes a P-type gate region 9, an N-type channel region 10 and an N-type source region 11. A channel is formed at least in a part of the N-type channel region 10. The channel is controlled by a voltage of the gate region 9. The JFET of the present embodiment includes a plurality of the gate regions 9. The channel region 10 intersects each of the gate regions 9 when viewed in a planar view. The channel region 10 is arranged or disposed to cross the gate region 9 from the source side to the drain side.

In the present specification, when it refers to arrangements, positions or shapes of members when viewed in a planar view, or just in a planar view, it means arrangements, positions or shapes of orthogonal projections of the members which are vertically projected onto a plane parallel to the surface of the semiconductor substrate. Thus, an orthogonal projection of the gate region onto a plane parallel to the surface of the semiconductor substrate and an orthogonal projection of the channel region onto the plane parallel to the surface of the semiconductor substrate intersect each other on the plane. The surface of the semiconductor substrate is defined as an interface between a semiconductor region and an insulator. The projection may be a shadow of an object which is produced on a plane when the object is exposed to parallel rays which are vertical to the plane.

A part of the channel region 10 (indicated as region 10d in FIG. 1) forms a drain region of the JFET. The channel of the JFET is formed in an intersectional part between the gate region 9 and the channel region 10. An impurity density of the source region 11 is higher than an impurity density of the channel region 10. The source region 11 is electrically connected to an output line 14 via a contact plug 12. The FD region 3 is electrically connected to the gate region 9. In the above described configuration, the JFET outputs a signal based on the voltage of the FD region 3.

The reset MOS (metal oxide semiconductor) transistor includes a P-type drain region 5, a P-type source region 7 and a gate electrode 8. The drain region 5 is electrically connected to a reset drain wiring 13 via a contact plug 6. The source region 7 of the reset MOS transistor is electrically connected to the gate region 9 of the JFET. In the above described configuration, the reset MOS transistor resets the voltage of a gate of the JFET. It may be simple to use an MOS transistor for the reset transistor. Other type of transistors including JFET may be used for the reset transistor.

The JFET includes a plurality of the gate regions 9 which spread out when viewed in a planar view. The gate regions 9 are arranged or disposed to sandwich the source region 11 in the planar view. In other words, an orthogonal projection of the source region 11 onto a plane parallel to the surface of the semiconductor substrate is located, in the plane, between orthogonal projections of the gate regions 9 onto the plane. Further, the JFET includes a plurality of the drain regions. More precisely, the channel region 10 includes a plurality of drain-side portions 10d. Each of the drain regions is arranged or disposed on opposite side to the source region 10 with respect to corresponding one of the gate regions 9. The channel is formed for each of the gate regions 9. The gate regions 9 may be arranged or disposed in parallel to each other when viewed in a planar view. The gate regions 9 are electrically connected to each other by a semiconductor region having the same conductivity type as the gate regions 9. In the present embodiment, the FD region 3 and the source region 7 of the reset MOS transistor electrically connect the gate regions 9 to each other.

According to the above described configuration, the effective channel width of the JFET may be widened. That is to say, the drive capability of the JFET may be improved. Thus, the imaging apparatus may operate at a high speed. The JFET may include only a single gate region. Specifically, one of the two gate regions 9 illustrated in FIG. 1 and a corresponding drain region may be removed.

The pixel includes a P-type semiconductor region 21. The semiconductor region 21 overlaps with the source region 11 when viewed in a planar view. In other words, an orthogonal projection of the P-type semiconductor region 21 onto a plane parallel to the surface of the semiconductor substrate overlaps with an orthogonal projection of the source region 11 onto the plane. The P-type semiconductor region 21 is arranged or disposed between the two gate regions 9 when viewed in a planar view. In other words, the orthogonal projection of the P-type semiconductor region 21 onto the plane parallel to the surface of the semiconductor substrate is located between the orthogonal projections of the two gate regions 9 onto the plane. The P-type semiconductor region 22 overlaps with a part of the channel region 10 when viewed in a planar view. In other words, the orthogonal projection of the P-type semiconductor region onto the plane parallel to the surface of the semiconductor substrate overlaps with a part of an orthogonal projection of the channel region 10 onto the plane.

FIG. 2 is a diagram schematically illustrating a cross sectional structure of the imaging apparatus of the present embodiment. FIG. 2 schematically illustrates the cross sectional structure along a line A-B in FIG. 1. Elements of FIG. 2 corresponding to those illustrated in FIG. 1 are designated by the same reference numerals as in FIG. 1.

FIG. 2 illustrates a semiconductor substrate 100. An insulator film which is not illustrated is provided on the semiconductor substrate 100. A surface SR of the semiconductor substrate 100 is defined as an interface between the semiconductor substrate 100 and the insulator film which is not illustrated. A channel length direction is defined as a direction which is parallel both to a paper plane of FIG. 2 and to the surface SR. A depth direction of the semiconductor substrate 100 is defined as a direction vertical to the surface SR.

The photodiode and the JFET are formed in an N-type semiconductor region 15. A drain current (or, channel current) of the JFET is provided by the N-type semiconductor region 15. A drain current providing portion configured to provide the drain current for the N-type semiconductor region 15 is formed in a part of a pixel area or outside the pixel area. The drain current providing portion, for example, includes a contact plug connecting the semiconductor substrate and a wiring.

Under the N-type semiconductor region 15 is an N-type semiconductor region 16 which has a higher impurity density than that of the N-type semiconductor region 15. The resistance of the semiconductor substrate 100 may be lowered by the N-type semiconductor region 16. Accordingly, it may be possible to reduce a voltage drop due to the drain current provided for the JFET. Thus, it may be possible to reduce noises such as shading which occurs because the voltage of the semiconductor substrate varies depending on locations. As a result, image quality may be improved. Otherwise, the drain current may be increased. As a result, the imaging apparatus may operate at a high speed.

The drain-side portion 10d of the channel region 10 may be omitted and a part of the N-type semiconductor region 15 may form the drain region. The drain region may be defined as an N-type semiconductor region which is arranged or disposed, in a planar view, adjacently to a region where the channel is to be formed.

The gate region 9 includes a surface gate region 9-1 and a buried gate region 9-2. Both of the surface gate region 9-1 and the buried gate region 9-2 are of P-type. The two surface gate regions 9-1 are arranged or disposed in a direction along the surface SR. The two buried gate regions 9-2 are arranged or disposed in a direction along the surface SR. The surface gate region 9-1 and the buried gate region 9-2 are arranged or disposed in a depth direction. The surface gate region 9-1 is arranged or disposed between the surface SR of the semiconductor substrate 100 and the buried gate region 9-2.

The channel region 10 is arranged or disposed at a depth between the surface gate region 9-1 and the buried gate region 9-2. A lateral JFET is formed in the above described configuration. In the lateral JFET, the channel length direction is parallel to the surface SR of the semiconductor substrate 100.

The surface gate region 9-1 and the buried gate region 9-2 are electrically connected to each other. A connection portion between the surface gate region 9-1 and the buried gate region 9-2 is arranged or disposed not to overlap with the channel region 10 when viewed in a planar view. According to the above described configuration, the channel of the JFET may be controlled both by the surface gate region 9-1 and by the buried gate region 9-2.

The surface gate region 9-1 and the buried gate region 9-2 overlap with each other when viewed in a planar view. In other words, an orthogonal projection of the surface gate region 9-1 onto a plane parallel to the surface of the semiconductor substrate is identical to an orthogonal projection of the buried gate region 9-2 onto the plane. In the above described configuration, the surface gate region 9-1 and the buried gate region 9-2 may be formed with the same mask, which is advantageous for reducing fluctuations in a characteristic of the JFET.

The orthogonal projection of the surface gate region 9-1 is not necessary to be identical to the orthogonal projection of the buried gate region 9-2. For example, the surface gate region 9-1, the buried gate region 9-2 and the channel region 10 may be arranged or disposed such that the surface gate region 9-1 intersects the channel region 10 in a planar view while the buried gate region 9-2 contains completely the channel region 10 in the planar view. In the above described configuration, the surface gate region 9-1 and the buried gate region are formed with different masks.

Either the surface gate region 9-1 or the buried gate region 9-2 may be omitted. In the present embodiment, each of the gate regions 9, which spread out when viewed in a planar view, includes the surface gate region 9-1 and the buried gate region 9-2. However, at least one of the gate regions 9 which spread out in the planar view may have the surface gate region 9-1 or the buried gate region 9-2.

As illustrated in FIG. 2, the P-type semiconductor region 21 is arranged or disposed between the two buried gate regions 9-2. The P-type semiconductor region 21 is arranged or disposed at a deeper position than the channel region 10. When the P-type semiconductor region 21 and the channel region 10 are formed by ion implantations, a peak in an impurity density profile, or distribution, along a depth direction of the P-type semiconductor region 21 is located at a deeper position than a peak in an impurity density profile along the depth direction of the channel region 10. The depth direction is defined as a vertical direction to the surface SR.

In the present embodiment, the entirety of the P-type semiconductor region 21 is arranged or disposed at the same depth as the buried gate region 9-2. In some embodiment, only a part of the P-type semiconductor region may be arranged or disposed at the same depth as the buried gate region 9-2

An impurity density of the P-type semiconductor region 21 is lower than an impurity density of the buried gate region 9-2. The P-type semiconductor region 21 and the buried gate region 9-2 are electrically connected to each other. Specifically, a P-type semiconductor region spatially continues from the P-type semiconductor region 21 to the buried gate region 9-2.

As a variation of the present embodiment, there may be a depletion layer between the P-type semiconductor region 21 and the buried gate region 9-2. In other words, there may be an N-type semiconductor region which is depleted between the P-type semiconductor region 21 and the buried gate region 9-2.

In the configuration where the impurity density of the P-type semiconductor region 21 is lower than the impurity density of the buried gate region 9-2, it may be difficult of the source region 11 to be depleted. As a result, the electrical characteristic of the JFET may be improved. The P-type semiconductor region 21 provided between the two buried gate regions 9-2 may reduce a parasitic current which runs through a region between the two buried gate regions 9-2.

In a variation of the present embodiment, an N-type semiconductor region may be arranged or disposed continuously between the two buried gate regions 9-2, instead of the P-type semiconductor region 21. In the above described configuration, fluctuations in the electrical characteristic of the JFET may be reduced. The entirety of the N-type semiconductor region arranged or disposed continuously between the two buried gate regions 9-2 may be depleted. In other words, the two buried gate regions 9-2 may be connected via a depletion layer. In this configuration, a potential barrier by the depletion layer is formed between the two buried gate regions 9-2, which may reduce a parasitic current running through a region between the two buried gate regions 9-2.

Here, another aspect of the cross sectional structure illustrated in FIG. 2 will be described. A P-type semiconductor region arranged or disposed at a deeper position than the channel region 10 has an impurity density profile, or distribution, which is featured. The P-type semiconductor region includes a first portion, a second portion and a third portion. An impurity density of the second portion and an impurity density of the third portion are respectively higher than an impurity density of the first portion. The first portion is arranged or disposed between the second portion and the third portion. The P-type semiconductor region 21 may correspond to the first portion. The two buried gate regions 9-2 may correspond to the second and third portions.

The first portion overlaps with the source region 11 when viewed in a planar view. In other words, an orthogonal projection of the first portion onto a plane parallel to the surface SR of the semiconductor substrate overlaps with the orthogonal projection of the source region 11 onto the plane. In the present embodiment, the second portion and the third portion do not overlap with the source region when viewed in a planar view. In another embodiment, the second portion and the third portion may overlap with the source region when viewed in a planar view.

According to the above described configuration, since the impurity density of the first portion is low, it may be difficult for the source region to be depleted. As a result, the electrical characteristic of JFET may be improved.

Figure 3A:
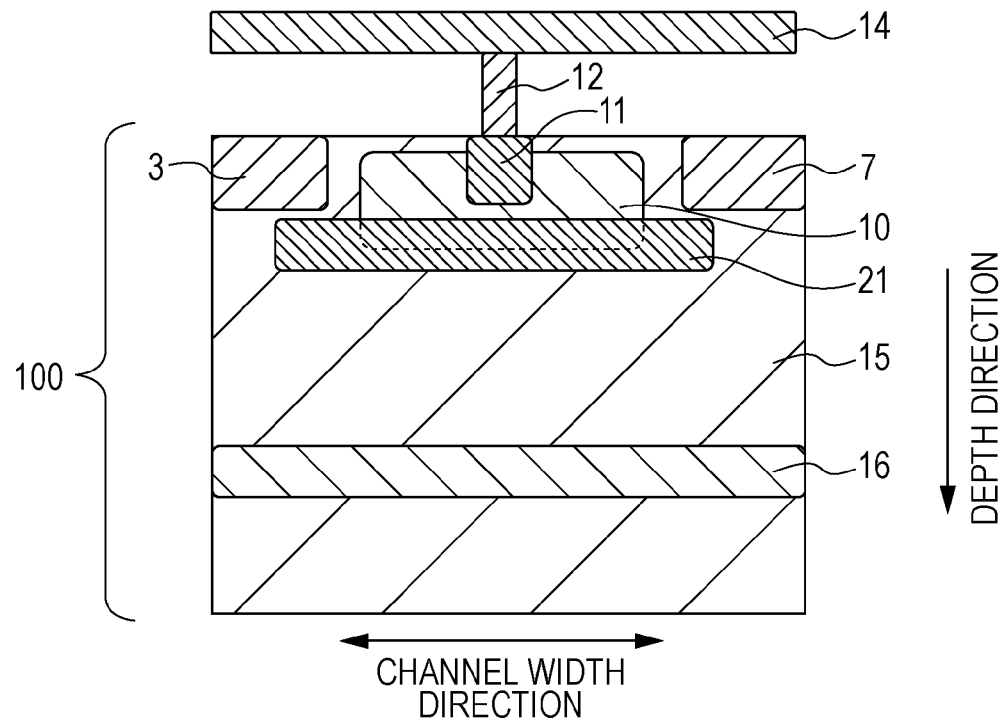
FIG. 3A is a diagram schematically illustrating a cross sectional structure of an imaging apparatus.

FIG. 3A is a diagram schematically illustrating a cross sectional structure of the imaging apparatus of the present embodiment. FIG. 3 schematically illustrates the cross sectional structure along a line C-D in FIG. 1. Elements of FIG. 3A corresponding to those illustrated in FIG. 1 and/or in FIG. 2 are designated by the same reference numerals as in FIG. 1 and/or as in FIG. 2. A channel width direction is defined as a direction which is parallel both to a paper plane of FIG. 3A and to the surface SR.

As illustrated in FIG. 3A, the P-type semiconductor region 21 is wider than the channel region 10 in the channel width direction. In the present embodiment, P-type semiconductor region 21 extends to the extent that the P-type semiconductor region 21 reaches a region directly under the FD region 3 and a region directly under the source region 7 of the reset MOS transistor. The P-type semiconductor region 21 may prevent ohmic conduction between the channel region 10 and the N-type semiconductor region 15. Actually, potential profiles may be designed such that electrical resistance, along a vertical direction to the surface SR, between the channel region 10 and the N-type semiconductor region 15 may be higher than the electrical resistance, along the channel length direction, between the source and the drain of the JFET.

Figure 3B:
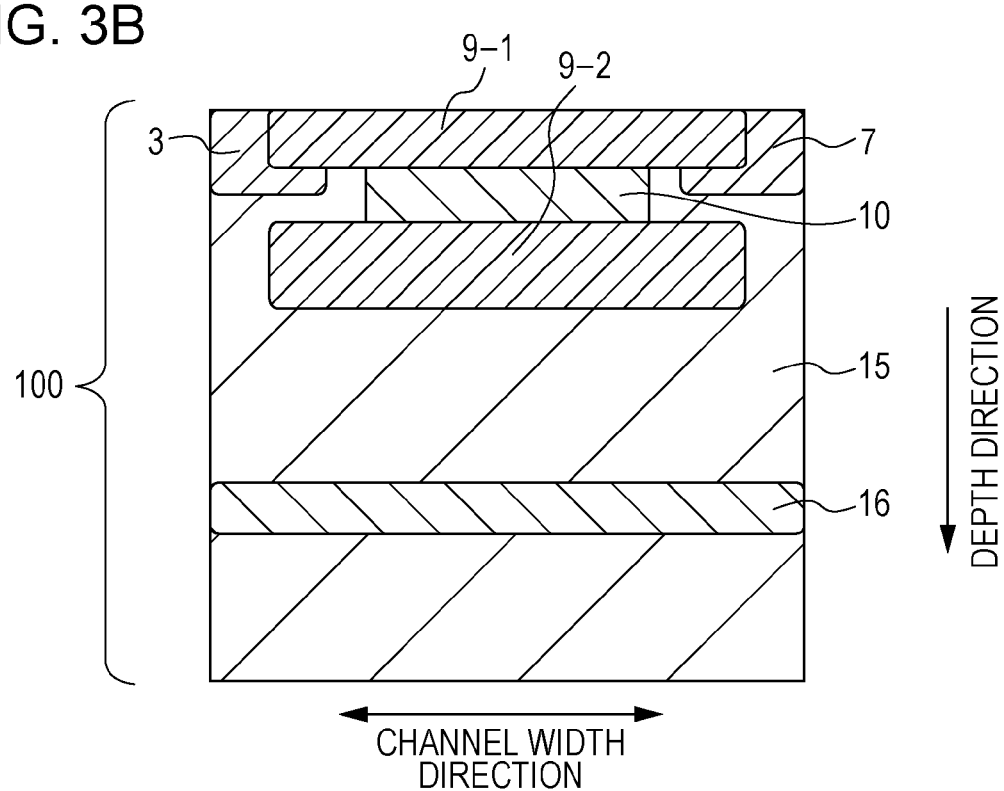
FIG. 3B is a diagram schematically illustrating a cross sectional structure of an imaging apparatus.

FIG. 3B is a diagram schematically illustrating a cross sectional structure of the imaging apparatus of the present embodiment. FIG. 3B schematically illustrates the cross sectional structure along a line E-F in FIG. 1. Elements of FIG. 3B corresponding to those illustrated in any of FIGS. 1 through 3A are designated by the same reference numerals as in FIG. 1 through FIG. 3A. A channel width direction is defined as a direction which is parallel both to a paper plane of FIG. 3B and to the surface SR.

As mentioned above, the surface gate region 9-1 and the buried gate region 9-2 are electrically connected to each other. In the present embodiment, the region having the same conductivity type electrically connects the surface gate region 9-1 and the buried gate region 9-2. For example, in FIG. 3B, the FD region 3 and the source region 7 of the reset MOS transistor may extend toward deep into the semiconductor substrate to the extent that they may electrically connect the surface gate region 9-1 and the buried gate region 9-2. Although, in FIG. 3, the surface gate region 9-1 and the buried gate region 9-2 are arranged or disposed with a distance therebetween, the surface gate region 9-1 and the buried gate region 9-2 may be formed, as another variation, in spatially continuously by an impurity diffusion along a vertical direction to the surface SR.

In the present embodiment, the gate region 9 and the channel region 10 intersect each other in the planar structure illustrated in FIG. 1. In other words, the orthogonal projection of the gate region 9 onto the plane parallel to the surface of the semiconductor substrate and the orthogonal projection of the channel region 10 onto the plane parallel to the surface of the semiconductor substrate intersect each other.

Intersecting of the gate region 9 and the channel region 10 means that each region is arranged or disposed to cross over the other region. In other words, at least two parts of the gate region 9 protrude out of the channel region 10 and at least two parts of the channel region 10 protrude out of the gate region 9.

A part of the channel region which is arranged or disposed between the two gate regions 9 when viewed in a planar view of FIG. 1 is defined as a source-side portion 10s of the channel region 10. A part, within the channel region 10, arranged or disposed on the opposite side to the source-side region 10s with respect to the gate region 9 is defined as the drain-side portion 10d of the channel region 10. FIG. 2 also indicates the source-side portion 10s and the drain-side portion 10d, respectively. Each of the source-side portion 10s and the drain-side portion 10d of the channel region 10 does not overlap with the gate region 9. In other words, the source-side portion 10s and the drain-side portion 10d of the orthogonal projection of the channel region 10 respectively protrude out of the orthogonal projection of the gate region 9. Accordingly, as illustrated in FIG. 2, the channel length of the JFET is defined by the end of the gate region 9. As illustrated in FIG. 3B, the channel width of the JFET is defined by the end of the channel region 10.

According to the above described configuration, even though there may be alignment errors between a mask used to form the gate region 9 and a mask used to form the channel region 10, a shape of the channel of the JFET is almost steady, or constant, or unchanged. Thus, fluctuations in the channel length and the channel width of the JFET may be reduced. As a result, fluctuations in the characteristic of the JFET may be reduced.

The reduction of the fluctuation in the electrical characteristic of the JFET may be achieved regardless of the shape of the gate region 9 or the shape of the channel region 10. The reduction of the fluctuation may be obtained because of the structure where the gate region 9 and the channel region intersect each other when viewed in a planar view. A periphery, in a planar view, of the gate region 9 may include two parallel lines along the channel width direction, as illustrated in FIG. 1. In this configuration, the fluctuation in the electrical characteristic may be reduced further. A periphery, in a planar view, of the channel region 10 may include two parallel lines along the channel length direction, as illustrated in FIG. 1. In this configuration, the fluctuation in the electrical characteristic may be reduced further. The gate region 9 and/or the channel region 10 may have rectangular shapes, respectively, so that masks used to form the gate region 9 and the channel region may be simplified. The peripheries of the gate region 9 and the channel region 10 may include curves. In this configuration, fluctuations in the electrical characteristic of the JFET, due to a rotational alignment error, may be reduced.

The channel length of the JFET is defined as a distance between the drain-side end and the source-side end of the gate region 9. The drain-side portion 10d and the source-side portion 10s of the channel region 10 are divided into both sides of the gate region 9 when viewed in a planar view, which leads to the reduction of the fluctuation in the characteristics. In other words, the reduction of the fluctuation in the characteristics may be obtained by that each of the source-side portion 10s and the drain-side portion 10d of the orthogonal projection of the channel region 10 protrudes out of the orthogonal projection of the gate region 9.

Figure 4A:
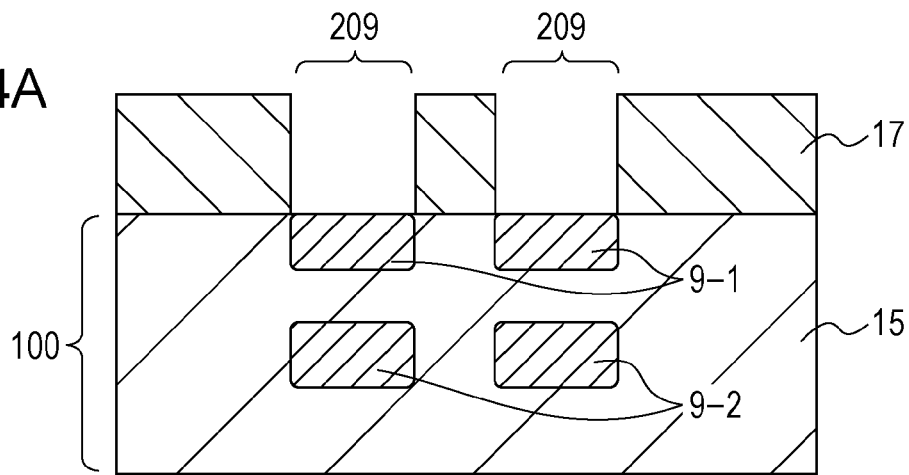
FIGS. 4A-4C are diagrams used to explain a manufacturing method of an imaging apparatus.
Figure 4B:
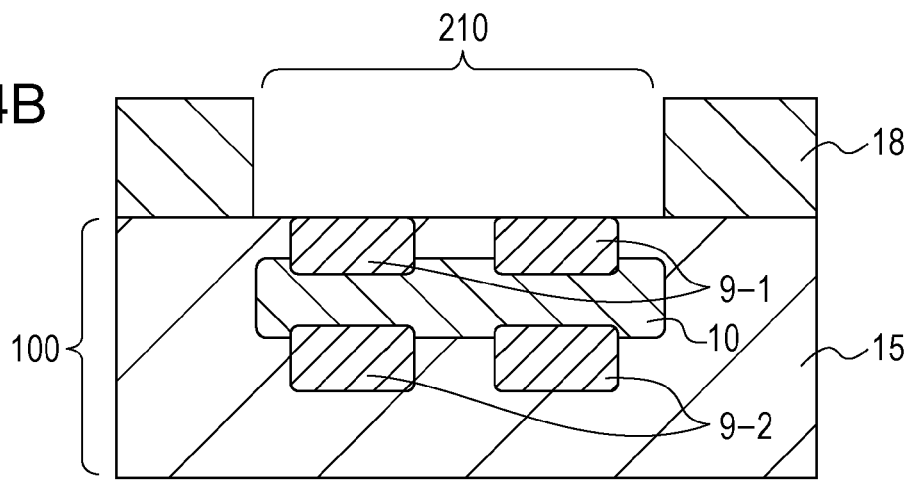
Figure 4C:
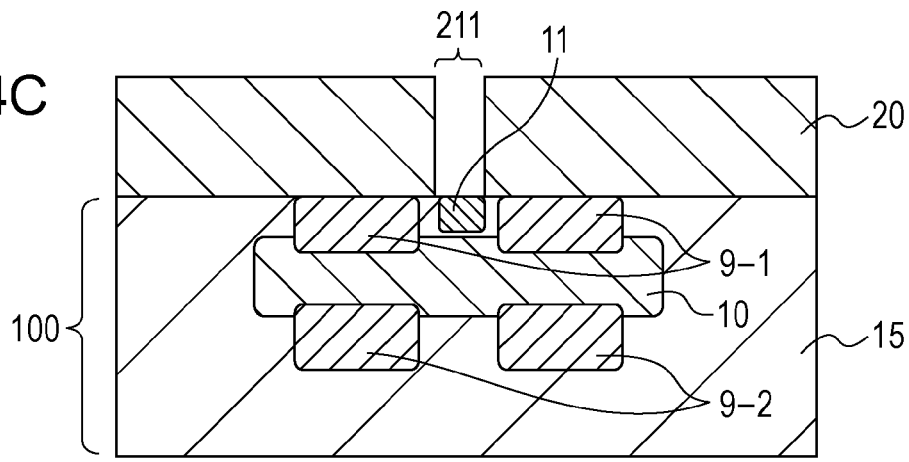

Hereinafter, an example of a manufacturing method of the imaging apparatus of the present embodiment will be explained. FIGS. 4A-4C are diagrams to explain a manufacturing method of the imaging apparatus of the present embodiment. Each of FIGS. 4A-4C schematically illustrates a cross sectional structure along a line A-B in FIG. 1. Elements of FIGS. 4A-4C corresponding to those illustrated in any of FIGS. 1 through 3B are designated by the same reference numerals as in FIGS. 1 through 3B.

In a step illustrated in FIG. 4A, the gate region 9 of the JFET is formed. In this step, a first mask 17 which defines a first opening 209 is used. The first mask 17 is, for example, obtained by patterning a photoresist by photolithography method.

Impurities to be acceptors, such as boron, are doped into the semiconductor substrate 100 through the first opening 209, whereby the gate region 9 is formed in a region corresponding to the first opening 209. For example, the gate region 9 may be formed by an ion implantation using the first mask 17. By performing a plurality of ion implantations at different implantation energies, the surface gate region 9-1 and the buried gate region 9-2 may be formed at different depths from each other. Generally, a higher energy is used to form a semiconductor region at a deeper position in the semiconductor substrate 100. According to the implantation energies, the surface gate region 9-1 and the buried gate region 9-2 may be formed spatially continuously by an impurity diffusion along a vertical direction to the surface SR. After forming the gate region 9, the first mask 17 is removed.

Besides the ion implantation, a thermal diffusion method may be used to dope the semiconductor substrate 100 with the impurity.

In a step illustrated in FIG. 4B, the channel region 10 of the JFET is formed. In this step, a third mask 18 which defines a third opening 210 is used. The third mask 18 is, for example, obtained by patterning a photoresist by photolithography method.

Impurities to be donors, such as phosphorus and arsenic, are doped into the semiconductor substrate 100 through the third opening 210, whereby the channel region 10 is formed in a region corresponding to the third opening 210. For example, the channel region 10 may be formed by an ion implantation using the third mask 18. The implantation energy used to form the channel region 10 may be adjusted so that the channel region 10 is formed at a depth between the surface gate region 9-1 and the buried gate region 9-2. After forming the channel region 10, the third mask 18 is removed.

Although it is not shown in FIG. 4, a P-type semiconductor region that electrically connects a plurality of the gate regions 9 to each other may be formed using a mask 19 which defines openings 203 and 207. The mask 19 is, for example, obtained by patterning a photoresist by a photolithography method.

In the present embodiment, the FD region 3 and the source region 7 of the reset MOS transistor are formed using the mask 19. These regions electrically connect the gate regions 9 to each other. After forming the P-type semiconductor region that electrically connects a plurality of the gate regions 9 to each other, the mask 19 is removed.

In a step illustrated in FIG. 4C, the source region 11 which is connected to the source-side portion 10s of the channel region 10 is formed. In this step, a fourth mask 20 which defines a fourth opening 211 is used. The fourth mask 20 is a hard mask. The fourth mask 20 includes an insulator film made of an inorganic material such as silicon oxide, silicon nitride, and silicon oxy-nitride.

Impurities to be donors, such as phosphorus and arsenic, are doped into the semiconductor substrate 100 through the fourth opening 211, whereby the source region 11 is formed in a region corresponding to the fourth opening 211.

The fourth mask 20 may be used as an interlayer insulation film, when the hard mask is used as the fourth mask 20 as mentioned above. Specifically, after forming the source region 11, the fourth mask 20 remains not to be removed, and then, the contact plug 12 electrically connected to the source region 11 is formed in the fourth opening 211. Thereafter, the output line 14 connected to the contact plug 12 is formed on the fourth mask 20.

Figure 5A:
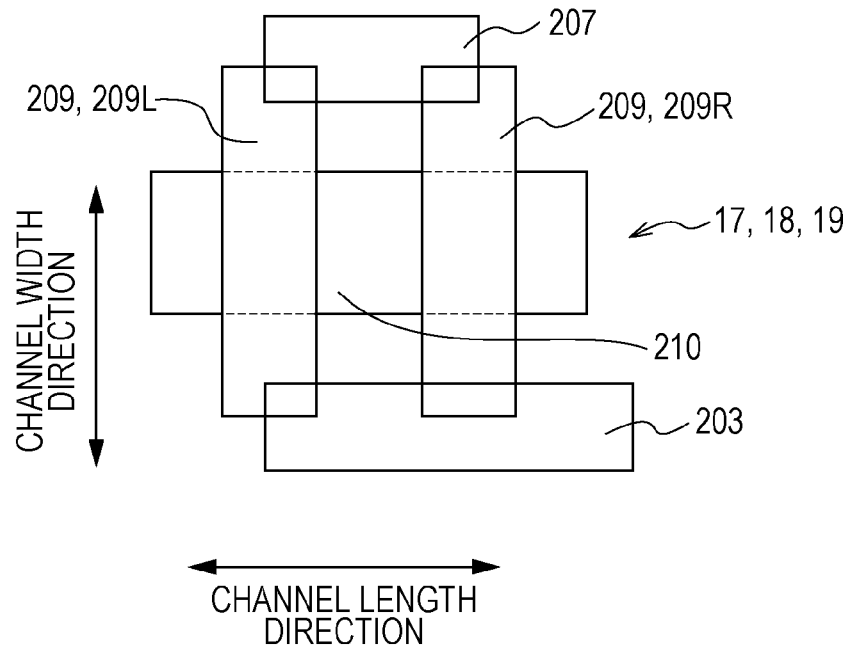
FIGS. 5A-5B are diagrams schematically illustrating masks used in manufacturing of an image apparatus.
Figure 5B:
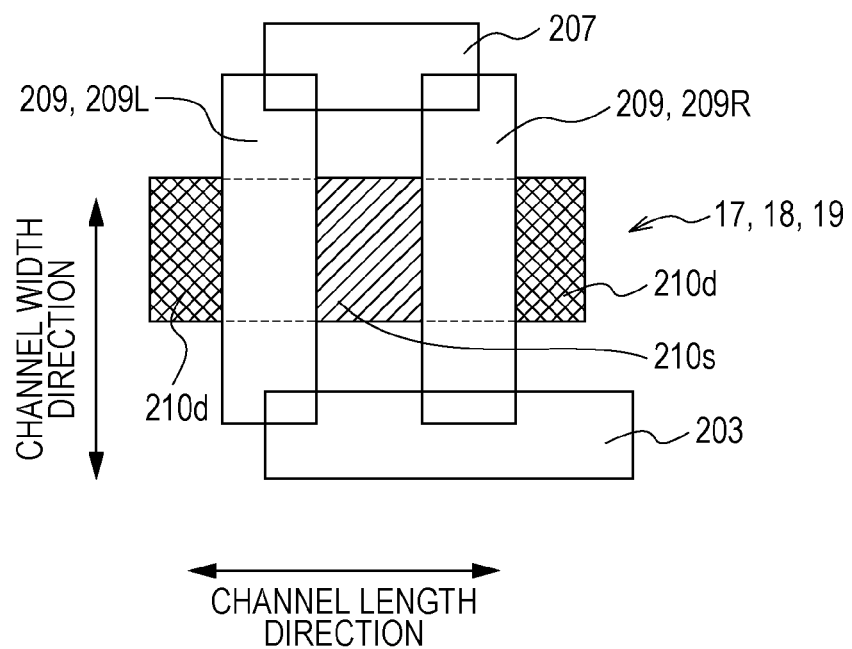

Next, planar structures of the masks 17-19 and relative positions thereof will be explained. FIGS. 5A and 5B are diagrams schematically illustrating the masks 17-19 used in the steps illustrated in FIGS. 4A-4C. Elements of FIGS. 5A-5B corresponding to those illustrated in any of FIGS. 4A through 4C are designated by the same reference numerals as in FIGS. 4A through 4C.

Each of FIGS. 5A and 5B illustrates the first opening 209, the third opening 210 and the openings 203 and 207. FIG. 5B distinguishes each part of the third opening 210. In the present embodiment, each of the first opening 209, the third opening 210 and the openings 203 and 207 has a rectangular shape. The first mask 17 which defines the first opening 209 is indicated as an area outside a rectangle indicating the opening 209. The third mask 18 which defines the third opening 210 is indicated as an area outside a rectangle indicating the third opening 210. The mask 19 which defines the openings 203 and 207 is indicated as an area outside rectangles indicating the openings 203 and 207.

For ease of explanation, the openings 209, 210, 203 and 207 are illustrated to overlap with each other in FIGS. 5A and 5B, whereby they indicates alignments between the masks. However, the mask may be removed after forming the corresponding semiconductor region in each step. Accordingly, two or more masks are not necessarily provided at the same time.

The first opening 209 and the third opening 210 intersect each other when viewed in a planar view. In other words, an orthogonal projection of the first opening 209 onto a plane parallel to the surface of the semiconductor substrate 100 intersect an orthogonal projection of the third opening 210 onto the plane.

As illustrated in FIG. 5B, the third opening 210 includes a source-side portion 210s and a drain-side portion 210d. The source-side portion 210s of the third opening 210 corresponds to the source-side portion 10s of the channel region 10. The drain-side portion 210d of the opening 210 corresponds to the drain-side portion 10d of the channel region 10. In FIG. 5B, there are two drain-side portions 210d: one is a part on left side of the first opening 209L, the other is a part on right side of the first opening 209R.

Each of the source-side portion 210s and the drain-side portion 210d of the third opening 210 overlaps with the first mask 17 when viewed in a planar view. In other words, each of an orthogonal projection of the source-side portion 210s onto a plane parallel to the surface of the semiconductor substrate 100 and an orthogonal projection of the drain-side portion 210d onto the plane overlaps with an orthogonal projection of the first mask 17 onto the plane. Accordingly, as illustrated in FIG. 5, the channel length of the JFET is defined by the ends of the first opening 209. The channel width of the JFET is defined by the ends of the third opening 210.

According to the above described configuration, even though there may be alignment errors between the first mask 17 used to form the gate region 9 and the third mask 18 used to form the channel region 10, a shape of the channel of the JFET is almost steady, or constant, or unchanged. Thus, fluctuations in the channel length and the channel width of the JFET may be reduced. As a result, fluctuations in the characteristic of the JFET may be reduced.

In the present embodiment, the first opening includes a plurality of openings 209L and 209R which are divided by the first mask 17. Each of the openings 209L and 209R intersects the third opening 210 when viewed in a planar view. In other words, each of orthogonal projections of the plurality of the opening 209L and 209R onto a plane parallel to the surface of the semiconductor substrate 100 intersects the orthogonal projection of the third opening 210. The source-side portion 210s of the third opening 210 overlaps with the first mask 17, specifically, with a part of the first mask 17 which is arranged or disposed between the two openings 209L and 209R, when viewed in a planar view.

The first opening 209 partially overlaps with the openings 203 and 207 when viewed in a planar view. In other words, the orthogonal projection of the first opening 209 onto a plane parallel to the surface of the semiconductor substrate 100 partially overlaps with the orthogonal projections of the openings 203 and 207 onto the plane.

According to the above described configuration, the effective channel width of the JFET may be widened. That is to say, the drive capability of the JFET may be improved. Thus, the imaging apparatus may operate at a high speed.

A step to form the P-type semiconductor region 21 will be explained. Here is an example where the P-type semiconductor region 21 is formed after the step illustrated in FIG. 4C. However, the P-type semiconductor region may be formed at any timing during the fabrication of the imaging apparatus. In the case where a hard mask is used for the fourth mask 20, the P-type semiconductor region 21 may be formed before forming the source region 11.

Figure 6A:
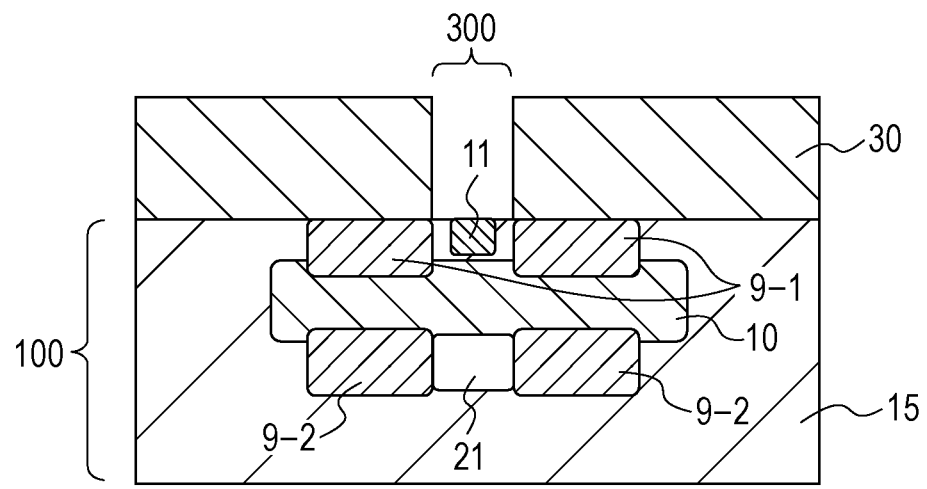
FIG. 6A is a diagram schematically illustrating a cross sectional structure of an imaging apparatus.

FIG. 6A is a diagram to explain a manufacturing method of the imaging apparatus. FIG. 6A schematically illustrates a cross sectional structure along a line A-B in FIG. 1. Elements of FIG. 6A corresponding to those illustrated in any of FIGS. 1 through 3B are designated by the same reference numerals as in FIGS. 1 through 3B.

In a step illustrated in FIG. 6A, the P-type semiconductor region 21 is formed. In this step, a second mask 30 which defines a second opening 300 is used. The second mask 30 is, for example, obtained by patterning a photoresist by photolithography method.

Impurities to be acceptors, such as boron, are doped into the semiconductor substrate 100 through the second opening 300, whereby the P-type semiconductor region 21 is formed in a region corresponding to the second opening 300. For example, the P-type semiconductor region 21 may be formed by an ion implantation using the second mask 30. After forming the P-type semiconductor region 21, the second mask 30 is removed.

In the above step, the impurities to be acceptors are doped into a region at the same depth as the buried gate region 9-2. When the P-type semiconductor region 21 is formed by an ion implantation, the implantation energy used to form the P-type semiconductor region 21 may be adjusted such that the impurities to be acceptors are doped into the region at the same depth as the buried gate region 9-2.

In the present embodiment, the impurities to be acceptors are doped, whereby the P-type semiconductor region 21 is formed. As a variation, an N-type semiconductor region may be formed between the two buried gate regions 9-2. In the structure of the aforementioned variation, an impurity density of the N-type semiconductor region may be lowered by doping of the impurities as illustrated in FIG. 6A. As a result, the parasitic current may be reduced.

Besides the ion implantation, a thermal diffusion method may be used to dope the semiconductor substrate 100 with the impurity.

Figure 6B:
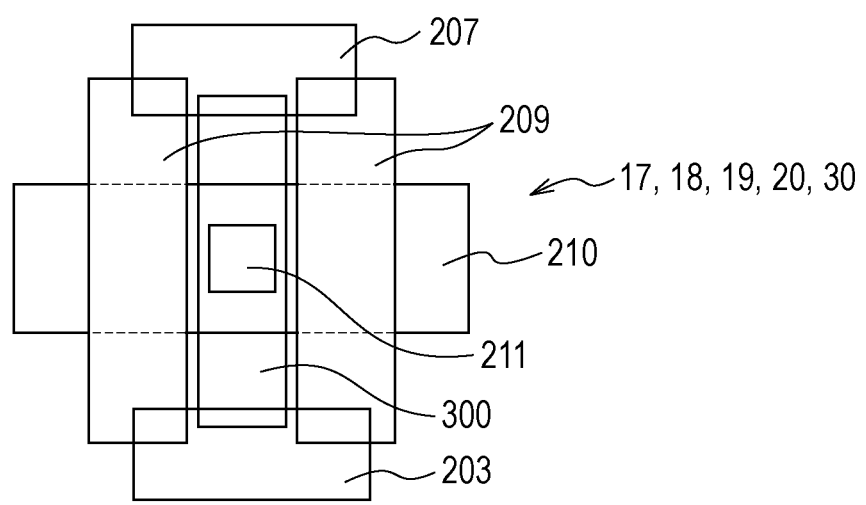
FIG. 6B is a diagram schematically illustrating masks used in manufacturing an imaging apparatus.

Next, the planar structure of the second mask 30 and relative positions between the second mask 30 and the masks 17-20 will be explained. FIG. 6B is a diagram schematically illustrating the masks 17-20 and 30 used in the steps illustrated in FIGS. 4A-4C and 6A. Elements of FIG. 6B corresponding to those illustrated in any of FIGS. 4A through 4C are designated by the same reference numerals as in FIGS. 4A through 4C.

FIG. 6B illustrates the first opening 209, the second opening 300, the third opening 210, the fourth opening 211 and the openings 203, 207. In the present embodiment, the second opening 300 has a rectangular shape. The second mask 30 which defines the second opening 300 is indicated as an area outside a rectangle indicating the second opening 300. In the present embodiment, the fourth opening 211 has a square shape. The fourth mask 20 which defines the fourth opening 211 is indicated as an area outside a square indicating the fourth opening 211.

For ease of explanation, a plurality of openings is illustrated to overlap with each other in FIG. 6B, whereby FIG. 6B indicates alignments between the masks. However, the mask may be removed after forming the corresponding semiconductor region in each step. Accordingly, two or more masks are not necessarily provided at the same time.

Figure 7A:
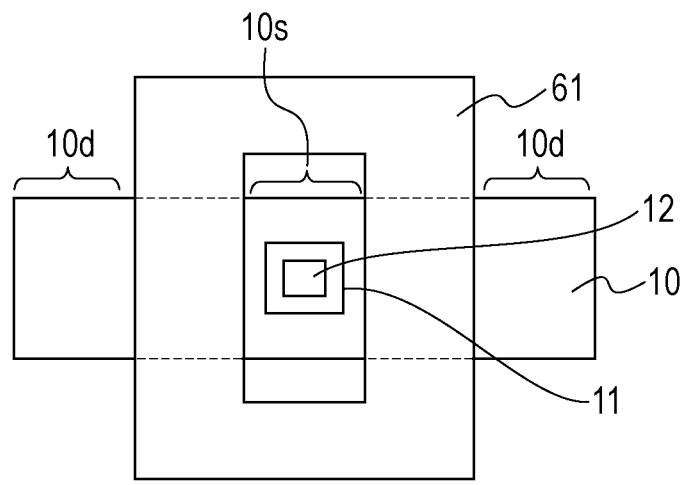
FIG. 7A is a diagram schematically illustrating a planar structure of an imaging apparatus.

Here, a variation of the present embodiment will be explained. FIG. 7A is a diagram schematically illustrating a planar structure of an imaging apparatus of the present embodiment. A JFET is illustrated in FIG. 7A. Elements of FIG. 7A corresponding to those illustrated in FIG. 1 are designated by the same reference numerals as in FIG. 1. The structure of the imaging apparatus is similar to the first embodiment except for those explained otherwise. As not illustrated in FIG. 7A, the P-type semiconductor region 21 is actually provided in the same way as FIG. 1.

One of the features of the present embodiment is a shape of a gate region 61 of the JFET. Specifically, the gate region 61 surrounds the source-side portion 10s of the channel region 10 when viewed in a planar view. Two parts of the gate region 61 respectively intersect the channel region 10 when viewed in a planar view. Each of the source-side region 10s and the drain-side region 10d of the channel region 10 does not overlap with the gate region 61. Each of the source-side region 10s and the drain-side region 10d protrudes out of the gate region 61. Accordingly, the channel length of the JFET is defined by the end of the gate region 61. The channel width of the JFET is defined by the end of the channel region 10.

According to the above described configuration, even though there may be alignment errors between a mask used to form the gate region 61 and a mask used to form the channel region 10, a shape of the channel of the JFET is almost steady, or constant, or unchanged. Thus, fluctuations in the channel length and the channel width of the JFET may be reduced. As a result, fluctuations in the characteristic of the JFET may be reduced.

In the variation illustrated in FIG. 7A, the gate region 61 is spatially continuous. The surface gate region and the buried gate region are electrically connected to each other via a connecting portion which does not overlap with the channel region 10 when viewed in a planar view. Thus, the effective channel width of the JFET may be widened while omitting the step to form the semiconductor region having the same conductivity type as the two gate regions and connecting the two gate regions. For example, a step to form the FD region 3 shown in FIG. 1 may be omitted.

Figure 7B:
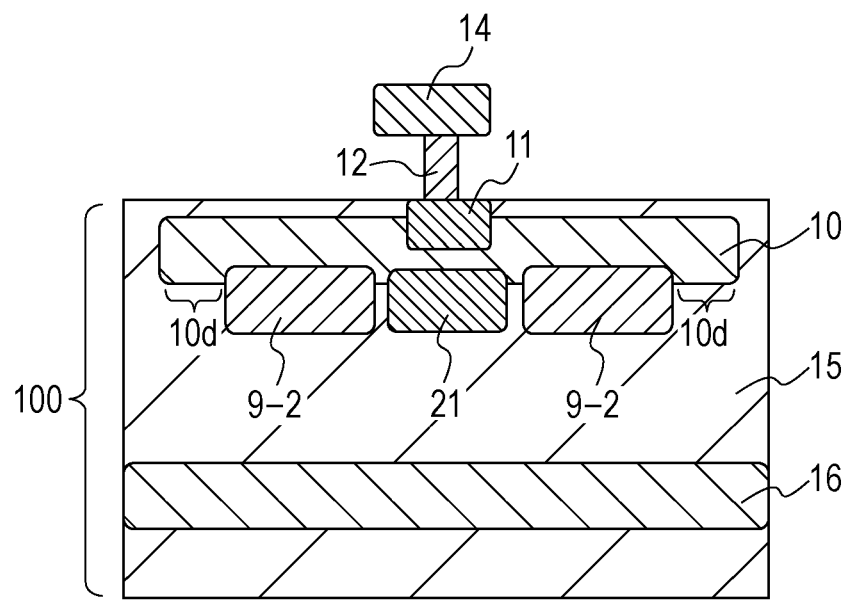
FIG. 7B is a diagram schematically illustrating a cross sectional structure of an imaging apparatus.

Here, another variation will be explained. FIG. 7B is a diagram schematically illustrating a cross sectional structure of an imaging apparatus of the present embodiment. A JFET is illustrated in FIG. 7B. Elements of FIG. 7B corresponding to those illustrated in FIG. 1 are designated by the same reference numerals as in FIG. 1. The structure of the imaging apparatus is similar to the first embodiment except for those explained otherwise. The gate region 9 of the JFET illustrated in FIG. 6C only includes the buried gate region 9-2.

As described above, according to some of the embodiments, the P-type semiconductor region 21 is provided in the pixel. The impurity density of the P-type semiconductor region 21 is lower than the impurity density of the buried gate region 9-2. According to the above described configuration, the P-type semiconductor region 21 may prevent the depletion layer from expanding into the source region. As a result, the characteristic of the JFET may be improved.

In some other embodiments, the depleted N-type semiconductor region is arranged or disposed to spatially continue from one of the buried gate region 9-2 to the other of the buried gate region 9-2. According to the above described configuration, the depletion layer may be prevented from expanding into the source region. As a result, the characteristic of the JFET may be improved.

A region between the two buried gate regions 9-2 is doped with P-type impurities (acceptors). Accordingly, it may be possible to achieve a high electrical resistance between the channel region 10 and the N-type semiconductor region 15. As a result, it may be possible to reduce a parasitic current which runs through a region other than the channel defined by the gate region 9 and the channel region 10. Since the dependency of the parasitic current on the gate voltage is low, a large parasitic current may deteriorate the current-voltage characteristic of the JFET. Thus, reducing the parasitic current may improve the current-voltage characteristic of the JFET.

The impurity density of the P-type semiconductor region 21 may be adjusted to further reduce the parasitic current. Specifically, the impurity density of the P-type semiconductor region may be higher than the impurity density of the buried gate region.

Second Embodiment

Now, another embodiment will be described. The main difference from the first embodiment is that the JFET includes an LDD structure. The explanation will focus on the differences with the first embodiment, and the explanation on the same structure as the first embodiment will be omitted.

A planar structure of an imaging apparatus of the present embodiment is the same as the first embodiment. That is to say, FIG. 1 schematically illustrates the planar structure of the imaging apparatus of the present embodiment. In the present embodiment, an N-type semiconductor region is added to a region which overlaps with the gate regions of FIG. 1.

Figure 8A:
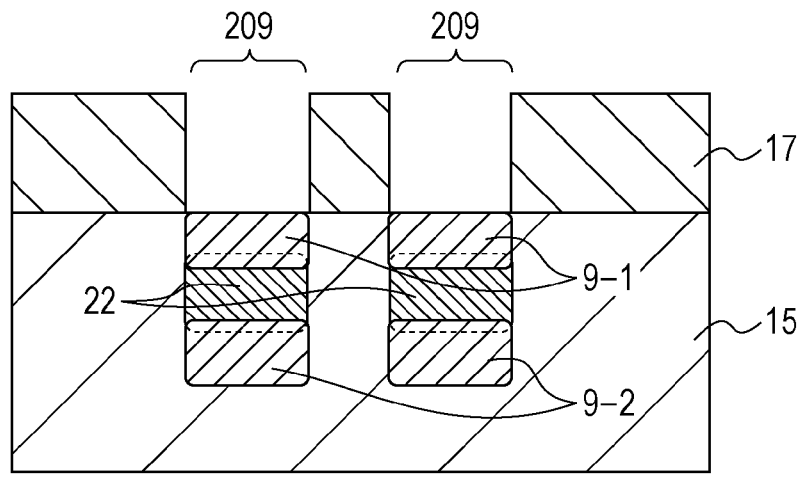
FIGS. 8A-8C are diagrams used to explain a manufacturing method of an imaging apparatus.
Figure 8B:
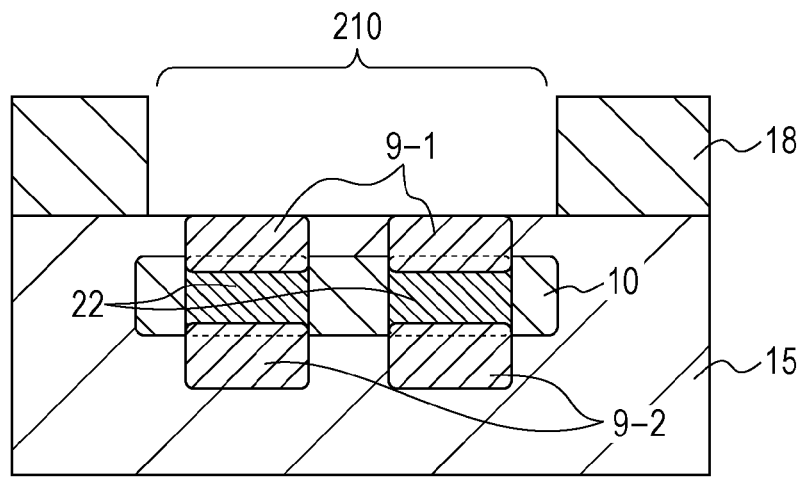
Figure 8C:
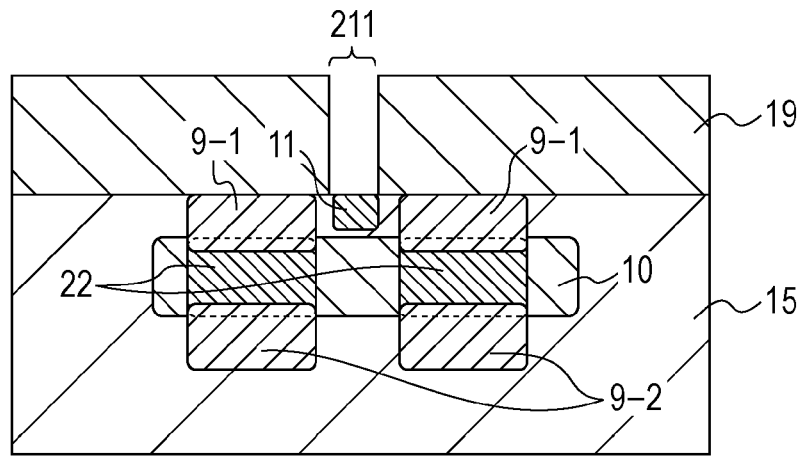

FIGS. 8A-8C are diagrams to explain a manufacturing method of the imaging apparatus of the present embodiment. Each of FIGS. 8A-8C schematically illustrates a cross sectional structure along a line A-B in FIG. 1, which is a cross section including the channel length direction of the JFET.

In a step illustrated in FIG. 8A, the surface gate region 9-1 and the buried gate region 9-2 are formed. A forming method of the surface gate region 9-1 and the buried gate region 9-2 is the same as those illustrated in FIG. 4A of the first embodiment. As described in the explanation of the first embodiment, the first mask 17 which defines the first opening 209 is used in this step.

In the present embodiment, an N-type semiconductor region 22 is formed using the first mask 17 which has been used or is to be used to form the surface gate region 9-1 and the buried gate region 9-2. Impurities to be donors, such as phosphorus and arsenic, are doped into the semiconductor substrate 100 through the first opening 209, whereby the N-type semiconductor region 22 is formed in a region corresponding to the first opening 209.

The first mask 17 is, for example, obtained by patterning a photoresist by photolithography method. Otherwise, the first mask 17 can be a hard mask.

The N-type semiconductor region 22 overlaps with the gate region 9 when viewed in a planar view. In other words, an orthogonal projection of the N-type semiconductor region 22 onto a plane parallel to the surface of the semiconductor substrate 100 is identical to the orthogonal projection of the gate region 9 onto the plane. The N-type semiconductor region 22 is arranged or disposed at a depth between the surface gate region 9-1 and the buried gate region 9-2. The surface gate region 9-1, the buried gate region 9-2 and the N-type semiconductor region 22 may be formed by ion implantations. In that case, the implantation energies used to form the surface gate region 9-1, the buried gate region 9-2 and the N-type semiconductor region 22 may be adjusted so that the N-type semiconductor region 22 is arranged or disposed at the depth between the surface gate region 9-1 and the buried gate region 9-2.

In a step illustrated in FIG. 8B, the channel region 10 of the JFET is formed. Since the step to form the channel region 10 is the same as those in the first embodiment, the explanation in detail will be omitted.

In a step illustrated in FIG. 8C, the source region 11 is formed. Since the step to form the source region 11 is the same as those in the first embodiment, the explanation in detail will be omitted.

A part, which has not been doped with impurities in the step illustrated in FIG. 8A, of the channel region 10 functions as a potential grading region (or, electric-field alleviation region). The channel is formed in a region where the channel region 10 and the N-type semiconductor region 22 overlap with each other. Impurities are doped into the region in each of the two steps of forming the channel region 10 and of forming the N-type semiconductor region 22. Accordingly, the other part of the channel region, i.e., the part which has not been doped with impurities in the step illustrated in FIG. 9A has a relatively low impurity density. Thus, it may be possible to decrease an impurity density of a part of the channel region 10, which protrudes out of the gate region 9.

According to the low impurity density drain, an electric field near the drain of the JFET may be alleviated. If a large electric field is generated in the vicinity of the drain of the JFET, the channel current causes impact-ionization, and thus, generates carriers. The generated carriers may run into the gate region 9 that accumulates signal carriers, whereby noise may be generated. The alleviation of the electrical field around the drain of the JFET may prevent the impact-ionization which causes a noise. As a result, noises in the pixel may be reduced.

Generally, the channel current of the JFET causes the impact-ionization in a pinch-off region near the drain region. To alleviate the electrical field of the pinch-off region and prevent the impact-ionization, a low impurity density of the drain region may be used.

In the present embodiment, the channel of the JFET may be formed by only the N-type semiconductor region 22 without forming the channel region 10. In this case, a part of the N-type semiconductor region 15 forms the drain region. Without the channel region 10, the channel width of the JFET is defined as a distance between the FD region 3 and the source region 7 of the reset MOS transistor along the channel width direction.

As described above, according to the present embodiment, noises may be reduced in addition to obtaining the technical effect of the first embodiment.

Third Embodiment

Figure 9:
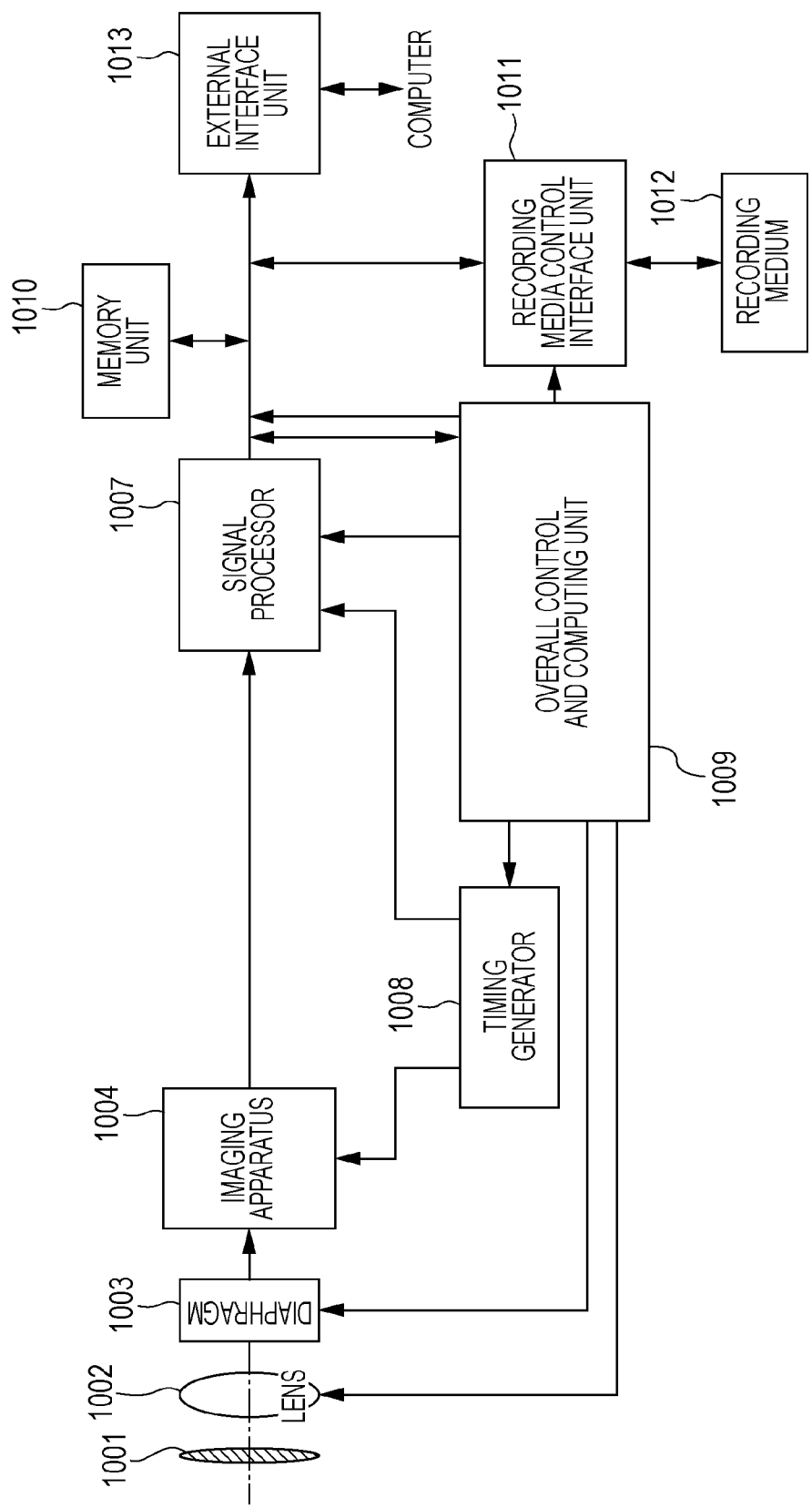
FIG. 9 is a brock diagram of an imaging system.

An imaging system according to an embodiment of the present disclosure will be described. Examples of the imaging system include digital still cameras, digital camcorders, copiers, facsimiles, mobile phones, in-vehicle cameras, and orbiting satellites. FIG. 9 illustrates a block diagram of a digital still camera serving as an example of the imaging system.

In FIG. 9, a reference numeral 1001 denotes a barrier for lens protection, 1002 denotes a lens causing the imaging apparatus 1004 to perform focusing on an optical image of a photographic subject, and 1003 denotes a diaphragm configured to change the amount of light passing through the lens 1002. A reference numeral 1004 denotes an imaging apparatus described in the above embodiments, and is configured to convert the optical image formed by the lens 1002 as image data. An analog-to-digital (AD) conversion unit is formed on a semiconductor substrate of the imaging apparatus 1004. A reference numeral 1007 denotes a signal processor configured to subject imaged data output by the imaging apparatus 1004 to various types of correction or to compress the imaged data. In FIG. 9, a reference numeral 1008 denotes a timing generator configured to output various types of timing signals to the imaging apparatus 1004 and signal processor 1007, and 1009 denotes an overall control unit configured to control the entire digital still camera. A reference numeral 1010 denotes a frame memory unit configured to temporarily store image data, 1011 denotes an interface unit configured to perform recording or readout on a recording medium, and 1012 denotes a recoding medium capable of connecting to and disconnecting from the imaging apparatus 1004, such as semiconductor memory or the like, configured to preform recording or readout of imaged data. Also, a reference numeral 1013 denotes an interface unit configured to communicate with an external computer or the like. Here, a timing signal or the like may be input from the outside of the imaging system. The imaging system may include at least the imaging apparatus 1004, and the signal processor 1007 configured to process the imaged signal output from the imaging apparatus 1004.

A configuration has been described in the present embodiment wherein the imaging apparatus 1004 and the AD conversion unit are provided to a different semiconductor substrate. However, the imaging apparatus 1004 and the AD conversion unit may be formed on the same semiconductor substrate. Also, the imaging apparatus 1004 and signal processor 1007 may be formed on the same semiconductor substrate.

Also, the signal processor 1007 may be configured to process a signal based on an electric carrier generated at the first photoelectric conversion unit 101A, and a signal based on an electric carrier generated at the second photoelectric conversion unit 102A to obtain distance information from the imaging apparatus 1004 to a subject.

The imaging apparatus according to one of the first embodiment and the second embodiment is employed as the imaging apparatus 1004 in the imaging system according to the present embodiment. Thus, the characteristic of the JFET may be improved by applying an embodiment of the present disclosure to an imaging system.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-267136 filed Dec. 25, 2013, which is hereby incorporated by reference herein in its entirety.

What is claimed is:

1. An imaging apparatus comprising:
a junction type field effect transistor provided in a semiconductor substrate,
wherein
the junction type field effect transistor includes a channel region of a first conductivity type, a source region of the first conductivity type, a first gate region of a second conductivity type, a second gate region of the second conductivity type, a third gate region of the second conductivity type and a fourth gate region of the second conductivity type,
the first gate region and the second gate region are disposed in a direction along a surface of the semiconductor substrate,
the third gate region and the fourth gate region are disposed in the direction along the surface of the semiconductor substrate, the first gate region and the third gate region are disposed in a depth direction of the semiconductor substrate, the first gate region is disposed between the surface and the third gate region, the second gate region and the fourth gate region are disposed in the depth direction, the second gate region is disposed between the surface and the fourth gate region, the channel region includes a first region which is disposed between the first gate region and the third gate region and a second region which is disposed between the second gate region and the fourth gate region, the source region is disposed between the first gate region and the second gate region, and a semiconductor region of the second conductivity type having an impurity density which is lower than an impurity density of the third gate region and is lower than an impurity density of the fourth gate region is disposed between the third gate region and the fourth gate region.

2. An imaging apparatus comprising:

a junction type field effect transistor provided in a semiconductor substrate, wherein the junction type field effect transistor includes a channel region of a first conductivity type, a source region of the first conductivity type, a first gate region of a second conductivity type, a second gate region of the second conductivity type, a third gate region of the second conductivity type and a fourth gate region of the second conductivity type, the first gate region and the second gate region are disposed in a direction along a surface of the semiconductor substrate, the third gate region and the fourth gate region are disposed in the direction along the surface of the semiconductor substrate, the first gate region and the third gate region are disposed in a depth direction of the semiconductor substrate, the first gate region is disposed between the surface and the third gate region, the second gate region and the fourth gate region are disposed in the depth direction, the second gate region is disposed between the surface and the fourth gate region, the channel region includes a first region which is disposed between the first gate region and the third gate region and a second region which is disposed between the second gate region and the fourth gate region, the source region is disposed between the first gate region and the second gate region, and a semiconductor region of the first conductivity type is provided to spatially continue from the third gate region to the fourth gate region.

3. The imaging apparatus according to claim 1, wherein an orthogonal projection of the channel region to a plane parallel to the surface intersects each of an orthogonal projection of the first gate region onto the surface and an orthogonal projection of the second gate region onto the surface.

4. The imaging apparatus according to claim 3, wherein the orthogonal projection of the first gate region onto the plane is identical to an orthogonal projection of the third gate region onto the plane, and the orthogonal projection of the second gate region onto the plane is identical to an orthogonal projection of the fourth gate region onto the plane.

5. The imaging apparatus according to claim 1, wherein a region having a same conductivity type as the third and fourth gate regions spatially continues throughout the semiconductor region from the third gate region to the fourth gate region.

6. The imaging apparatus according to claim 1, wherein a depletion layer is formed between the semiconductor region and the third gate region and/or between the semiconductor region and the fourth gate region.

7. The imaging apparatus according to claim 2, wherein a depletion layer is formed to spatially continue from the third gate region to the fourth gate region.

8. The imaging apparatus according to claim 1, wherein the channel region includes a third region which is disposed between the source region and the semiconductor region, and an impurity density of the source region is higher than an impurity density of the third region.

9. An imaging apparatus comprising:

a junction type field effect transistor provided in a semiconductor substrate, wherein the junction type field effect transistor includes a channel region of a first conductivity type, a source region of the first conductivity type and a semiconductor region of a second conductivity type, the channel region is disposed between the semiconductor region and a surface of the semiconductor substrate, at least a part of the source region is disposed between the channel region and the surface, the semiconductor region includes a first portion, a second portion and a third portion, an impurity density of the first portion is lower than an impurity density of the second portion and is lower than an impurity density of the third portion, the first portion is disposed between the second portion and the third portion, and an orthogonal projection of the first portion onto a plane parallel to the surface overlaps with an orthogonal projection of the source region onto the plane.

10. The imaging apparatus according to claim 9, wherein the channel region and each of the second portion and the third portion form a P-N junction.

11. The imaging apparatus according to claim 9, wherein an impurity density of the source region is higher than an impurity density of the channel region.

12. The imaging apparatus according to claim 9, wherein the junction type field effect transistor includes a gate region of the second conductivity type disposed between the surface and the channel region.

13. An imaging system comprising:

the imaging apparatus according to claim 1; and a signal processing unit configured to process a signal output from the imaging apparatus.

14. A manufacturing method of an imaging apparatus including a junction type field effect transistor provided in a semiconductor substrate, the manufacturing method comprising:

forming a gate region of the junction type field effect transistor by doping the semiconductor substrate with a first impurity using a first mask which defines a first opening; and doping a region at a same depth as at least a part of the gate region with a second impurity having a same conductivity type as the first impurity, using a second mask which defines a second opening, wherein
the first opening includes a plurality of sub-openings divided by the first mask,
an orthogonal projection of the second opening onto a plane parallel to a surface of the semiconductor substrate at least partially overlaps with an orthogonal projection of a part, which is disposed between the sub-openings, of the first mask onto the plane.

15. The manufacturing method according to claim 14, further comprising:
forming a channel region of the junction type field effect transistor by doping the semiconductor substrate with a third impurity using a third mask which defines a third opening;
wherein
each of orthogonal projections of the sub-openings onto the plane intersects an orthogonal projection of the third opening onto the plane.

16. The manufacturing method according to claim 14, wherein
the gate region includes a surface gate region and a buried gate region disposed at different depths from each other,
forming the gate region includes a plurality of ion implantations performed at different implantation energies from each other, each using the first mask, and
the second impurity is doped at a same depth as at least a part of the buried gate region.

17. The manufacturing method according to claim 16, further comprising:
forming a channel region of the junction type field effect transistor disposed between the surface gate region and the buried gate region.

18. The manufacturing method according to claim 17, wherein
the channel region is formed by doping the semiconductor substrate with a third impurity using a third mask which defines a third opening, and
each of orthogonal projections of the sub-openings onto the plane intersects an orthogonal projection of the third opening onto the plane.

19. The manufacturing method according to claim 16, further comprising:
forming a source region of the junction type field effect transistor disposed between the surface gate regions which are formed correspondingly to the plurality of the sub-openings.

20. The manufacturing method according to claim 14, further comprising:
forming a source region of the junction type field effect transistor by doping the semiconductor substrate with a fourth impurity using a fourth mask which defines a fourth opening,
wherein
an orthogonal projection of the fourth opening onto the plane overlaps with the orthogonal projection of the part, which is disposed between the sub-openings, of the first mask onto the plane, and
the orthogonal projection of the fourth opening onto the plane overlaps with the orthogonal projection of the second opening onto the plane.

* * * * *